(12) United States Patent
Kinjo

(10) Patent No.: US 12,185,590 B2
(45) Date of Patent: Dec. 31, 2024

(54) DISPLAY DEVICE INCLUDING AN ORGANIC LAYER

(71) Applicant: Japan Display Inc., Tokyo (JP)

(72) Inventor: Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 159 days.

(21) Appl. No.: 17/451,676

(22) Filed: Oct. 21, 2021

(65) Prior Publication Data

US 2022/0157905 A1    May 19, 2022

(30) Foreign Application Priority Data

Nov. 17, 2020  (JP) ................. 2020-190929

(51) Int. Cl.
| | | |
|---|---|---|
| *H10K 59/122* | (2023.01) | |
| *H10K 50/11* | (2023.01) | |
| *H10K 59/12* | (2023.01) | |
| *H10K 59/35* | (2023.01) | |

(52) U.S. Cl.
CPC .......... *H10K 59/122* (2023.02); *H10K 50/11* (2023.02); *H10K 59/12* (2023.02); *H10K 59/353* (2023.02); *H10K 59/35* (2023.02)

(58) Field of Classification Search
CPC ...... H10K 50/10; H10K 50/11; H10K 50/171; H10K 59/122; H10K 71/821; H10K 50/824; H10K 50/814; H01L 21/76229; H01L 27/153

See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2009/0256168 A1 | 10/2009 | Taneda et al. |

(Continued)

FOREIGN PATENT DOCUMENTS

| | | |
|---|---|---|
| CN | 101556989 A | 10/2009 |
| CN | 104112762 A | 10/2014 |

(Continued)

OTHER PUBLICATIONS

Office Action issued on Nov. 21, 2022, in corresponding Taiwanese Patent Application No. 110139464, 31 pages (including machine-generated English translation).

(Continued)

*Primary Examiner* — Bryan R Junge
*Assistant Examiner* — Mario Andres Autore, Jr.
(74) *Attorney, Agent, or Firm* — Maier & Maier, PLLC

(57) ABSTRACT

According to one embodiment, a display device includes a base, a first insulating layer disposed on the base, a first electrode disposed on the first insulating layer, a second insulating layer disposed on the first insulating layer and including an opening overlapping the first electrode, a first trench not overlapping the first electrode, and a first surface between the opening and the first trench, an organic layer including a light-emitting layer, and a second electrode covering the organic layer. The organic layer includes a first portion disposed in the opening and covering the first electrode, a second portion disposed on the first surface, and a third portion disposed in the first trench and separated from the second portion.

6 Claims, 14 Drawing Sheets

(56) References Cited

U.S. PATENT DOCUMENTS

| | | | |
|---|---|---|---|
| 2012/0223342 A1* | 9/2012 | Tanada | H10K 59/86 257/40 |
| 2012/0252303 A1 | 10/2012 | Otsuka et al. | |
| 2014/0159002 A1* | 6/2014 | Lee | H10K 50/844 438/34 |
| 2014/0312329 A1 | 10/2014 | Fujii et al. | |
| 2015/0144906 A1* | 5/2015 | Ichikawa | H10K 59/80522 438/34 |
| 2015/0188077 A1* | 7/2015 | Kim | H10K 50/805 438/46 |
| 2016/0043341 A1* | 2/2016 | Heo | H10K 59/122 438/23 |
| 2016/0268354 A1* | 9/2016 | Xiong | H10K 50/16 |
| 2016/0293888 A1* | 10/2016 | Shim | H10K 59/124 |
| 2017/0186831 A1 | 6/2017 | Nam et al. | |
| 2017/0278919 A1 | 9/2017 | Matsumi | |
| 2018/0120620 A1* | 5/2018 | Shim | H10K 59/1315 |
| 2018/0151831 A1* | 5/2018 | Lee | H10K 50/844 |
| 2018/0254429 A1 | 9/2018 | Lee et al. | |
| 2019/0081273 A1* | 3/2019 | Sung | H10K 50/80 |
| 2019/0103450 A1 | 4/2019 | Heo | |
| 2020/0168693 A1* | 5/2020 | Heo | H10K 71/00 |
| 2020/0185469 A1* | 6/2020 | Kim | H10K 59/38 |
| 2020/0212120 A1* | 7/2020 | Yang | H10K 59/351 |
| 2021/0091158 A1 | 3/2021 | Kasahara | |
| 2023/0422551 A1* | 12/2023 | Harada | H05B 33/22 |

FOREIGN PATENT DOCUMENTS

| | | | |
|---|---|---|---|
| DE | 102015116089 A1 | 9/2016 | |
| DE | 102018129973 A1 * | 6/2019 | G09F 9/33 |
| EP | 3163626 A2 * | 5/2017 | H01L 27/3244 |
| JP | 2000-195677 A | 7/2000 | |
| JP | 2004-207217 A | 7/2004 | |
| JP | 2007506227 A | 3/2007 | |
| JP | 2008-135325 A | 6/2008 | |
| JP | 2009-032673 A | 2/2009 | |
| JP | 2010-118191 A | 5/2010 | |
| JP | 2012216296 A | 11/2012 | |
| JP | 2017120782 A | 7/2017 | |
| KR | 20150061920 A * | 6/2015 | H10K 50/824 |
| WO | 2005027584 A1 | 3/2005 | |
| WO | WO 2019/026511 A1 | 2/2019 | |

OTHER PUBLICATIONS

Office Action issued on May 7, 2024, in corresponding Japanese Application No. 2020-190929, 6 pages.

Office Action issued on Mar. 27, 2024, in corresponding Chinese Application No. 202111352636.9, 21 pages.

Office Action issued on Aug. 19, 2024, in corresponding Chinese Application No. 202111352636.9, 14 pages.

Office Action issued on Aug. 27, 2024, in corresponding Japanese Application No. 2020-190929, 6 pages.

Examination Report issued on Nov. 4, 2024, in corresponding German Application No. 102021210744.3, 10 pages.

* cited by examiner

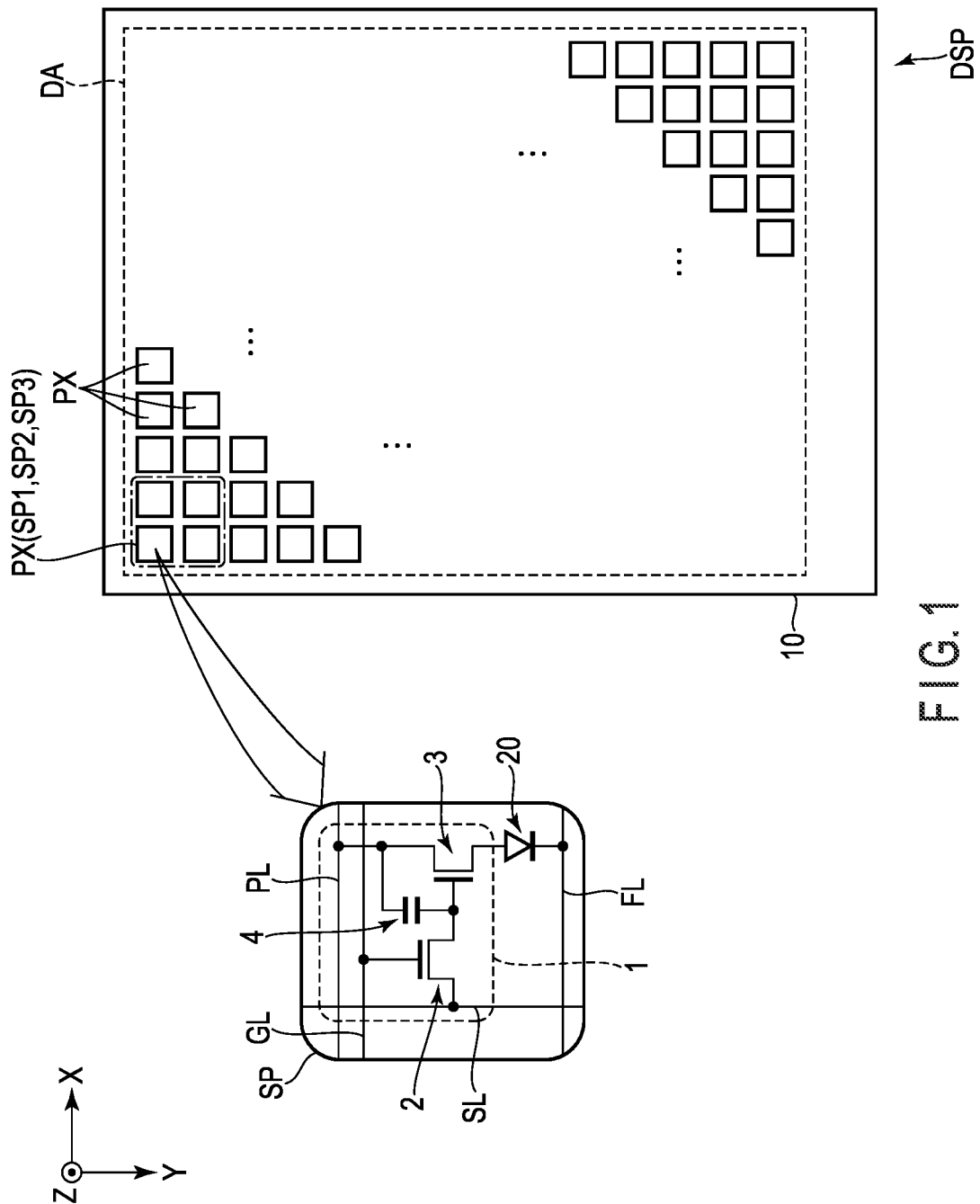
F I G. 1

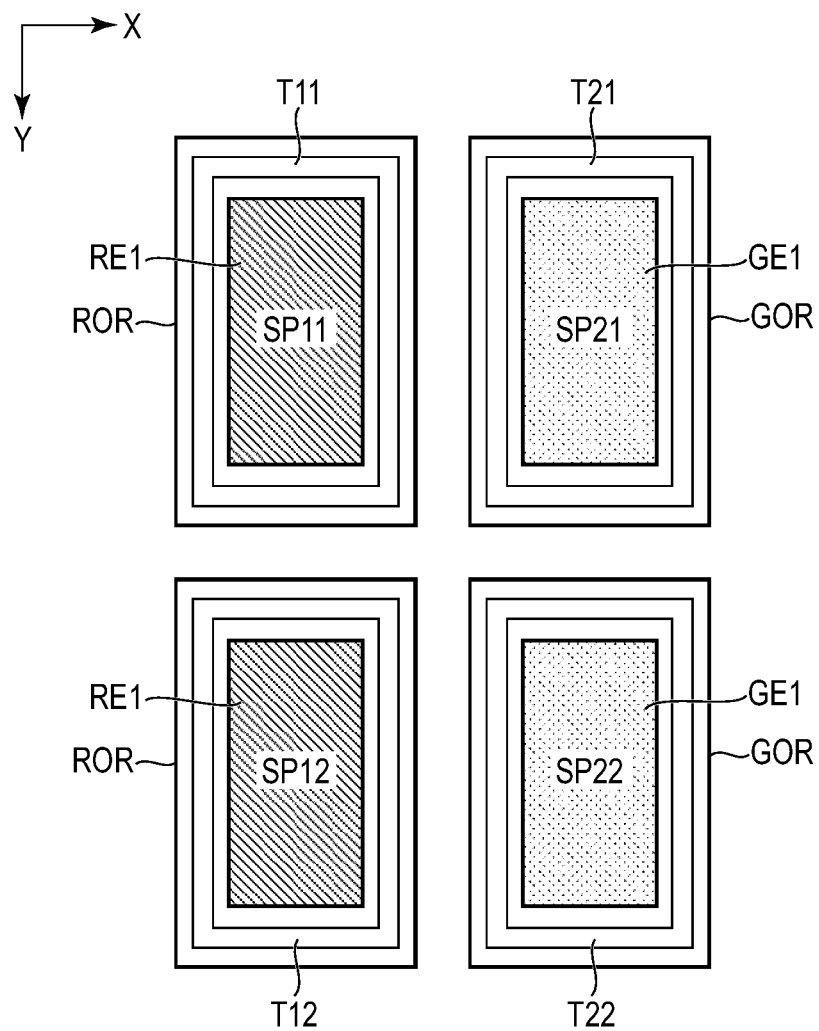
F I G. 7

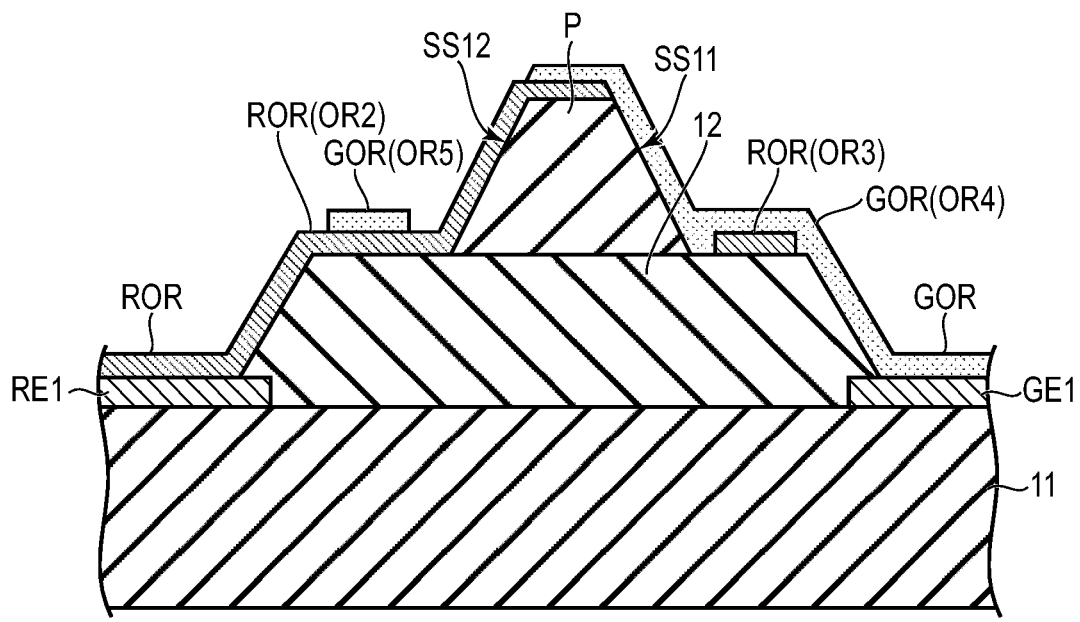
F I G. 15
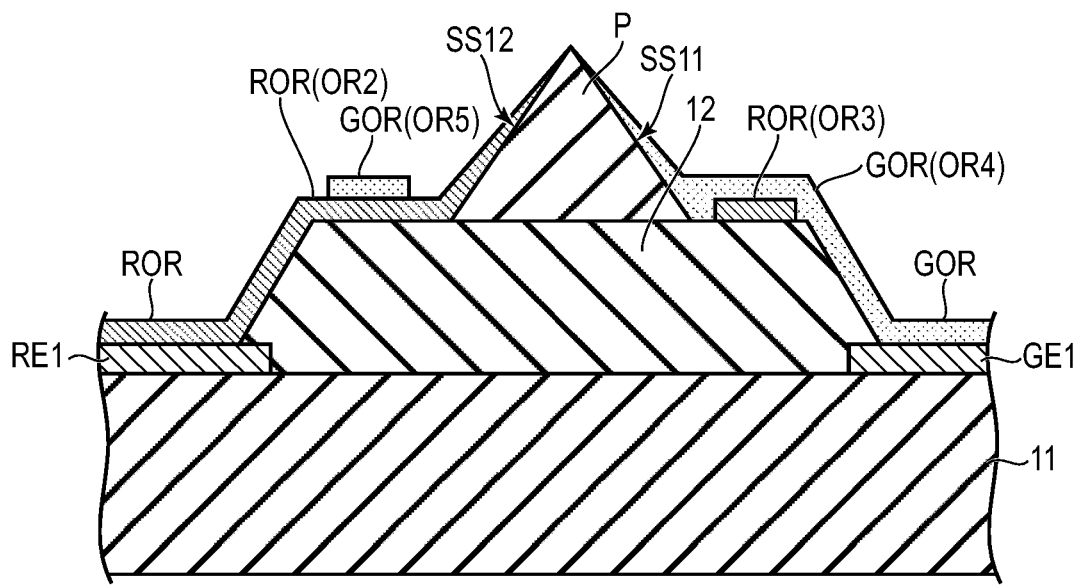
F I G. 16

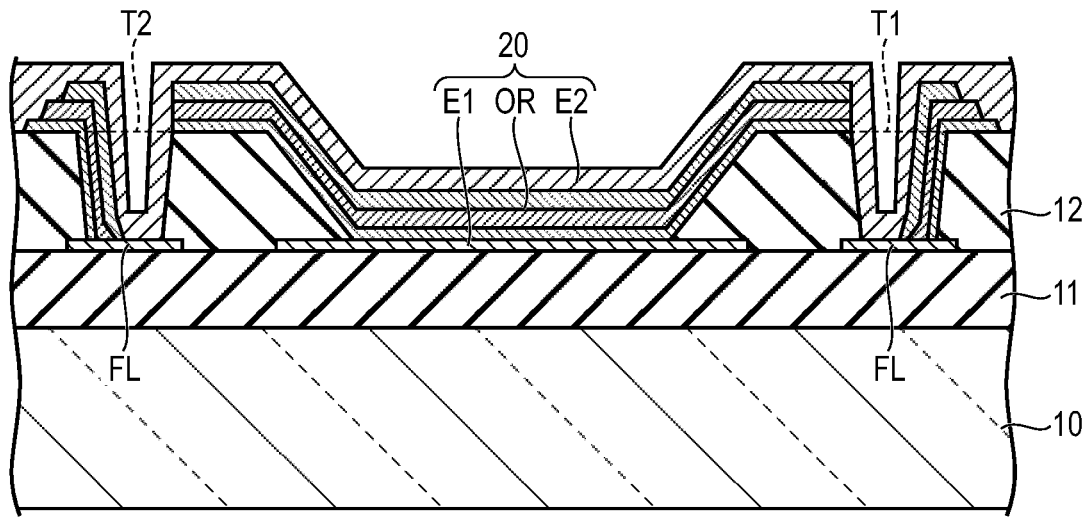
F I G. 17
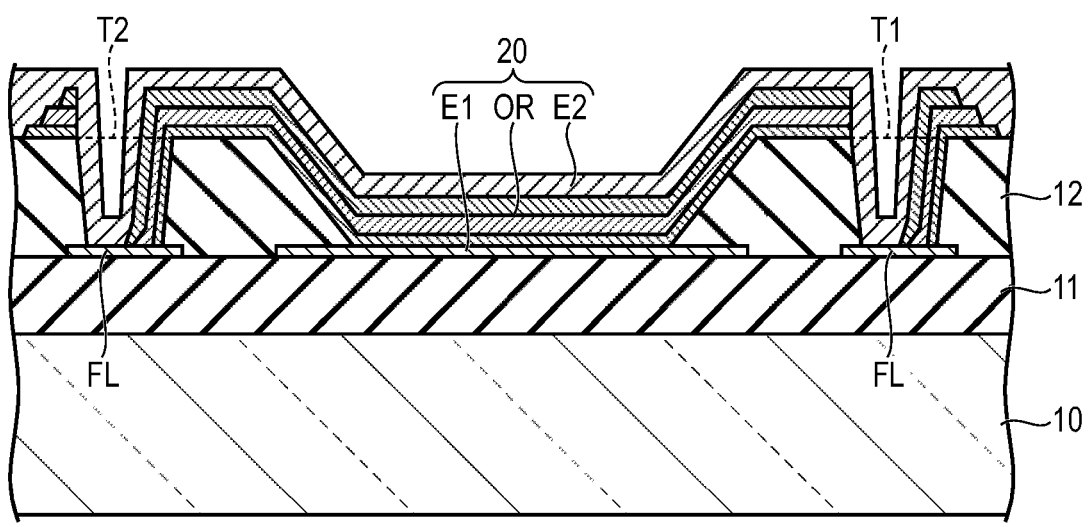
F I G. 18

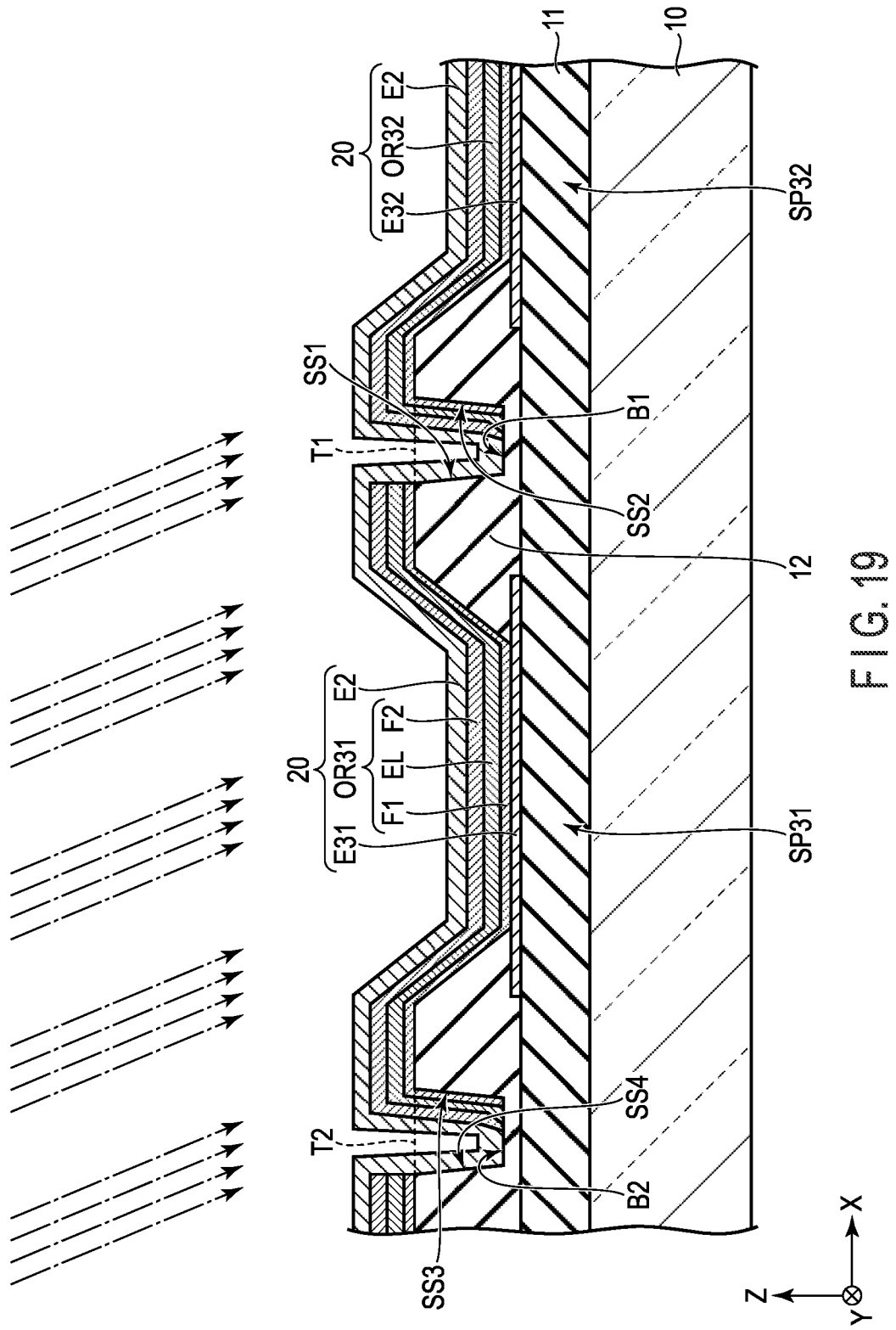
F I G. 19

DISPLAY DEVICE INCLUDING AN ORGANIC LAYER

CROSS-REFERENCE TO RELATED APPLICATIONS

This application is based upon and claims the benefit of priority from Japanese Patent Application No. 2020-190929, filed Nov. 17, 2020, the entire contents of which are incorporated herein by reference.

FIELD

Embodiments described herein relate generally to a display device.

BACKGROUND

In recent years, a display device to which an organic light-emitting diode (OLED) is applied as a display element has been put into practical use. The display element includes an organic layer disposed between a pixel electrode and a common electrode. The organic layer includes a light-emitting layer and includes also functional layers, such as a hole transport layer and an electron transport layer. Such an organic layer is formed by, for example, a vacuum vapor deposition method.

For example, when an organic layer including a stack of functional layers is formed, end surfaces of the functional layers are not aligned at the peripheral edge of the organic layer, which may lead to a deterioration in the performance of the display element.

BRIEF DESCRIPTION OF THE DRAWINGS

FIG. 1 depicts a configuration example of a display device DSP according to the present embodiment.

FIG. 7 is a plan view of an example of a second shape of the trenches.

FIG. 15 is a cross-sectional view of an example of a fifth structure.

FIG. 16 is a cross-sectional view of an example of a sixth structure.

FIG. 17 is a cross-sectional view of a first modification.

FIG. 18 is a cross-sectional view of a second modification.

FIG. 19 is a cross-sectional view of still another example of the display element 20.

DETAILED DESCRIPTION

Figure 2:
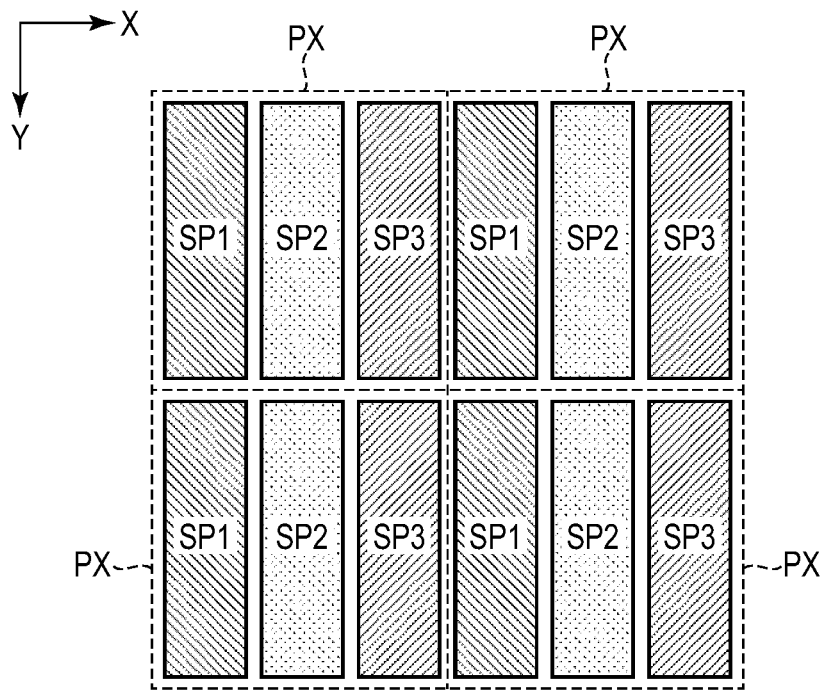
FIG. 2 depicts an example of layout of sub-pixels included in a pixel PX.

In general, according to one embodiment, there is provided a display device includes a base, a first insulating layer disposed on the base, a first electrode disposed on the first insulating layer, a second insulating layer disposed on the first insulating layer and including an opening overlapping the first electrode, a first trench not overlapping the first electrode, and a first surface between the opening and the first trench, an organic layer including a light-emitting layer, and a second electrode covering the organic layer. The organic layer includes a first portion disposed in the opening and covering the first electrode, a second portion disposed on the first surface, and a third portion disposed in the first trench and separated from the second portion.

According to another embodiment, there is provided a display device includes, a base, a first insulating layer disposed on the base, a first electrode disposed on the first insulating layer, a second insulating layer disposed on the first insulating layer and including an opening overlapping the first electrode, a first trench not overlapping the first electrode, a first surface between the opening and the first trench, a second trench located opposite to the first trench across the opening, and a second surface between the opening and the second trench, an organic layer including a light-emitting layer, and a second electrode covering the organic layer. The organic layer includes a first portion disposed in the opening and covering the first electrode, a second portion disposed on the first surface, a third portion disposed in the first trench and separated from the second portion, a fourth portion disposed on the second surface, and a fifth portion disposed in the second trench and adjacent to the fourth portion.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed descriptions thereof which are considered redundant are omitted where appropriate.

In the drawings, an X-axis, a Y-axis and a Z-axis which are orthogonal to each other are shown as needed for easier understanding. A direction along the X-axis is referred to as a first direction X, a direction along the Y-axis is referred to as a second direction Y, and a direction along the Z-axis is referred to as a third direction Z. A plane defined by the X-axis and the Y-axis is referred to as an X-Y plane, a plane defined by the X-axis and the Z-axis is referred to as an X-Z plane, and viewing the X-Y plane is referred to as plan view.

A display device DSP according to an embodiment of the present invention is an organic electroluminescence display device including an organic light-emitting diode (OLED) serving as a display element, and is incorporated in TV sets, personal computers, mobile terminals, mobile phones, and the like.

FIG. 1 depicts a configuration example of the display device DSP according to the present embodiment. The display device DSP includes a display portion DA on a base 10 having insulating properties, the display portion DA displaying an image. The base 10 is a transparent insulating substrate, and may be a glass or a flexible resin film.

The display portion DA includes a plurality of pixels PX arrayed in a matrix in the first direction X and the second direction Y. Each pixel PX includes a plurality of sub-pixels SP1, SP2, and SP3. In one example, the pixel PX includes the sub-pixel SP1 for red, the sub-pixel SP2 for green, and the sub-pixel SP3 for blue. In addition to the above sub-pixels for three colors, the pixel PX may further include sub-pixels for other colors, such as white, that is, may include four or more sub-pixels.

A configuration example of one sub-pixel SP included in the pixel PX will be briefly described.

Specifically, the sub-pixel SP includes a pixel circuit 1 and a display element 20 driven and controlled by the pixel circuit 1. The pixel circuit 1 includes a pixel switch 2, a drive transistor 3, and a capacitor 4. The pixel switch 2 and the drive transistor 3 are switching elements each including, for example, a thin-film transistor.

The pixel switch 2 has a gate electrode connected to a scanning line GL, a source electrode connected to a signal line SL, and a drain electrode connected to one electrode making up the capacitor 4 and to a gate electrode of the drive transistor 3. The drive transistor 3 has a source electrode connected to the other electrode making up the capacitor 4 and to a power line PL, and a drain electrode connected to the anode of the display element 20. The cathode of the display element 20 is connected to a feeder line FL. It should be noted that a configuration of the pixel circuit 1 is not limited to the configuration shown in FIG. 1.

The display element 20 is an organic light-emitting diode (OLED) serving as a light-emitting element. For example, the sub-pixel SP1 includes a display element that emits light with a red wavelength, the sub-pixel SP2 includes a display element that emits light with a green wavelength, and the sub-pixel SP3 includes a display element that emits light with a blue wavelength. A configuration of the display element 20 will be described later.

FIG. 2 depicts an example of layout of sub-pixels included in the pixel PX. Description will be made, with attention paid to four pixels PX indicated by single-dot chain lines in FIG. 1.

The sub-pixel SP1, sub-pixel SP2, and sub-pixel SP3 making up one pixel PX are each formed substantially into a rectangle elongated in the second direction Y, and are arranged in the first direction X. Paying attention to two pixels PX arranged in the first direction X reveals that the colors of light emissions from adjacent sub-pixels are different from each other. Paying attention to two pixels PX arranged in the second direction Y reveals that the colors of light emissions from adjacent sub-pixels are the same. It should be noted that respective areas of the sub-pixel SP1, the sub-pixel SP2, and the sub-pixel SP3 may be the same or different from each other.

Figure 3:
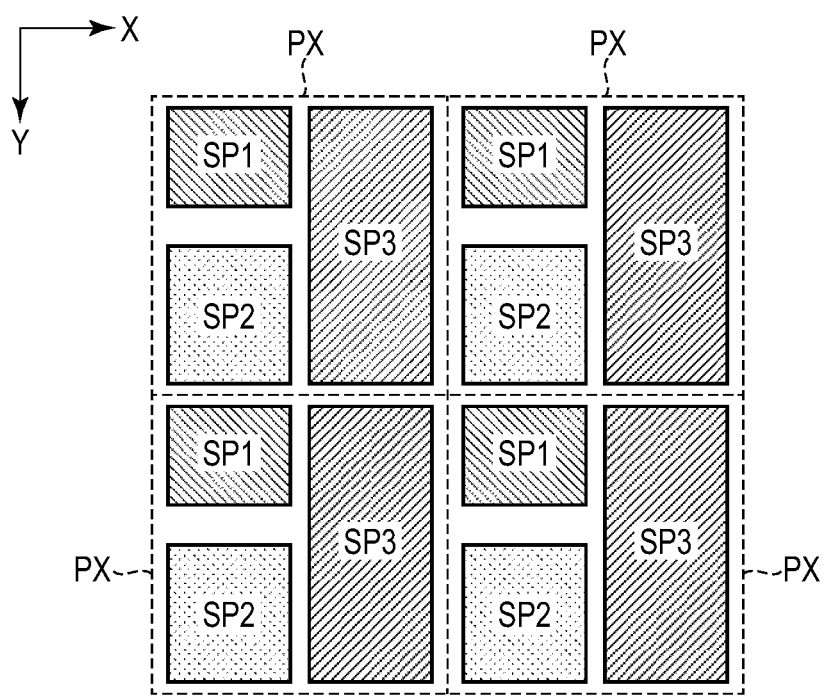
FIG. 3 depicts another example of layout of the sub-pixels included in the pixel PX.

FIG. 3 depicts another example of layout of the sub-pixels included in the pixel PX.

The sub-pixel SP1, sub-pixel SP2, and sub-pixel SP3 making up one pixel PX are arranged such that the sub-pixel SP1 and the sub-pixel SP2 are arranged in the second direction Y, the sub-pixel SP1 and the sub-pixel SP3 are arranged in the first direction X, and the sub-pixel SP2 and the sub-pixel SP3 are arranged in the first direction X. The sub-pixel SP1 is formed substantially into a rectangle elongated in the first direction X, while the sub-pixel SP2 and the sub-pixel SP3 are each formed substantially into a rectangle elongated in the second direction Y. The area of the sub-pixel SP2 is larger than the area of the sub-pixel SP1, and the area of the sub-pixel SP3 is larger than the area of the sub-pixel SP2. The area of the sub-pixel SP1 may be equal to the area of the sub-pixel SP2.

Paying attention to two pixels PX arranged in the first direction X reveals that the colors of light emissions from adjacent sub-pixels are different from each other in a region where the sub-pixel SP1 and the sub-pixel SP3 are arranged alternately and in a region where the sub-pixel SP2 and the sub-pixel SP3 are arranged alternately.

Paying attention to two pixels PX arranged in the second direction Y reveals that the colors of light emissions from adjacent sub-pixels are different from each other in a region where the sub-pixel SP1 and the sub-pixel SP2 are arranged alternately. In a region where a plurality of sub-pixels SP3 are arranged, the colors of light emissions from adjacent sub-pixels are the same.

It should be noted that the outline of each sub-pixel shown in FIGS. 2 and 3 corresponds to the outline of a first electrode of the display element or that of a light emission region of the display element. The outline is, however, depicted in a simplified form and does not necessarily show the actual shape of the sub-pixel.

Figure 4:
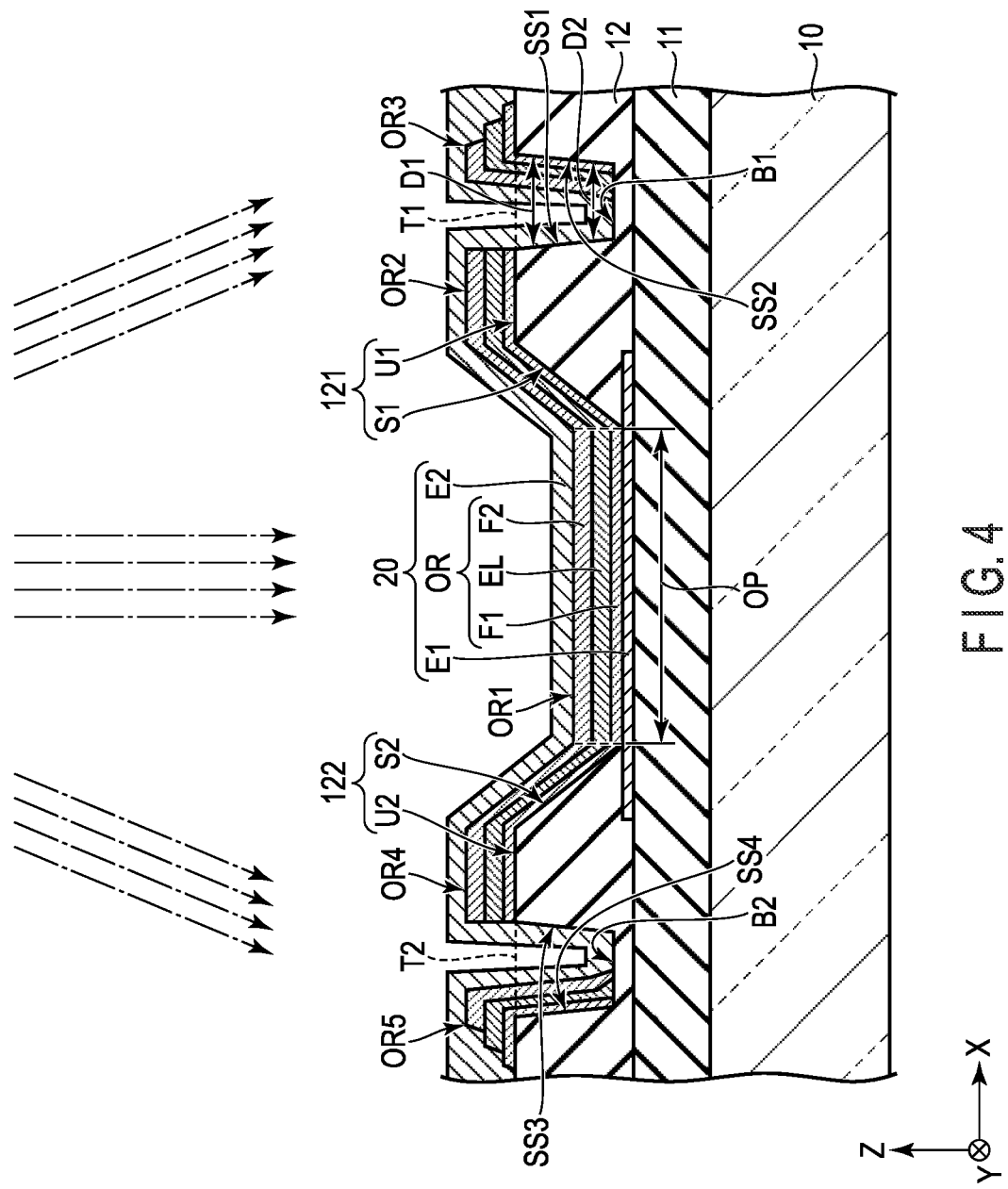
FIG. 4 is a cross-sectional view of an example of a display element 20.

FIG. 4 is a cross-sectional view of an example of the display element 20.

An insulating layer (first insulating layer) 11 is disposed on the base 10. The pixel circuit 1 shown in FIG. 1 is disposed on the base 10 and is covered with the insulating layer 11, but is not illustrated here as such. The insulating layer 11 corresponds to an underlayer of the display element 20, and is, for example, an organic insulating layer.

An insulating layer (second insulating layer) 12 is disposed on the insulating layer 11. The insulating layer 12 is, for example, an organic insulating layer. The insulating layer 12 is formed in such a way as to partition the display element 20 or the sub-pixel, and may be referred to as a rib, a partition wall, or the like.

The display element 20 includes a first electrode E1, an organic layer OR, and a second electrode E2. The first electrode E1 is disposed for each sub-pixel or each display element, and may be referred to as a pixel electrode, a lower electrode, an anode, or the like. The second electrode E2 is commonly disposed for a plurality of sub-pixels or a plurality of display elements, and may be referred to as a common electrode, a counter electrode, an upper electrode, a cathode, or the like.

The first electrode E1 is disposed on the insulating layer 11, and a peripheral portion of the first electrode E1 being covered with the insulating layer 12. The first electrode E1 is electrically connected to the drive transistor 3 shown in FIG. 1. The first electrode E1 is, for example, a transparent electrode formed of a transparent conductive material, such as indium tin oxide (ITO) and indium zinc oxide (IZO). The first electrode E1 may be a metal electrode formed of a metal material, such as, silver and aluminum. The first electrode E1 may be a laminate of a transparent electrode and a metal electrode. For example, the first electrode E1 may be configured as a laminate of a transparent electrode, a metal electrode, and a transparent electrode that are stacked in order, or may be configured as a laminate of three or more layers.

The organic layer OR is disposed on the first electrode E1. Such an organic layer OR includes the light-emitting layer EL. In the example shown in FIG. 4, the organic layer OR further includes functional layers F1 and F2. The functional layer F1, the light-emitting layer EL, and the functional layer F2 are stacked in order from the first electrode E1 side. The functional layers F1 and F2 each serve as, for example, a hole injection layer, a hole transport layer, a hole blocking layer, an electron injection layer, an electron transport layer, or an electron blocking layer, but may serve as other functional layers. Each of the functional layers F1 and F2 shown in FIG. 4 is not limited to a single layer, and may be a laminate of multiple functional layers stacked together. At least one of the functional layers F1 and F2 may be omitted.

The second electrode E2 covers the organic layer OR. The second electrode E2 is, for example, a transparent electrode formed of a transparent conductive material, such as ITO or IZO. The second electrode E2 is electrically connected to a feeder line disposed on the display portion DA or a feeder line disposed outside the display portion DA. The second electrode E2 may be covered with a transparent protective film (including at least one of an inorganic insulating film and an organic insulating film).

When the potential of the first electrode E1 is relatively higher than the potential of the second electrode E2, the first electrode E1 corresponds to an anode while the second electrode E2 corresponds to a cathode. When the potential of the second electrode E2 is relatively higher than the potential of the first electrode E1, the second electrode E2 corresponds to the anode while the first electrode E1 corresponds to the cathode.

In one example, when the first electrode E1 corresponds to the anode, the functional layer F1 between the light-emitting layer EL and the first electrode E1 includes at least one of a hole injection layer and a hole transport layer, and the functional layer F2 between the light-emitting layer EL and the second electrode E2 includes at least one of an electron transport layer and an electron injection layer.

Now the insulating layer 12 will be described more specifically.

The insulating layer 12 includes an opening OP, a first trench T1, a second trench T2, a first surface 121, and a second surface 122.

The opening OP is a through-hole that is formed in a region overlapping the first electrode E1 and that penetrates the insulating layer 12 to the first electrode E1. As described above, the peripheral portion of the first electrode E1 is covered with the insulating layer 12 as the central portion of the first electrode E1 is exposed from the insulating layer 12 in the opening OP.

The first trench T1 and the second trench T2 are formed in regions not overlapping the first electrode E1. The second trench T2 is located opposite to the first trench T1 across the opening OP in the first direction X. In the example shown in FIG. 4, each of the first trench T1 and the second trench T2 does not penetrate the insulating layer 12 through. The first trench T1 and the second trench T2, however, may each penetrate the insulating layer 12 to the insulating layer 11.

The first surface 121 corresponds to a part of the surface of insulating layer 12 that lies between the opening OP and the first trench T1. Such a first surface 121 includes a sloped surface S1 on the right side of the illustrated opening OP, and an upper surface U1 connected to the sloped surface S1.

The second surface 122 corresponds to a part of the surface of the insulating layer 12 that lies between the opening OP and the second trench T2. Such a second surface 122 includes a sloped surface S2 on the left side of the illustrated opening OP and an upper surface U2 connected to the sloped surface S2. The upper surfaces U1 and U2 are, for example, flat surfaces but may be curved surfaces.

In the first trench T1, the insulating layer 12 has a first side surface SS1, a second side surface SS2, and a bottom surface B1. The first side surface SS1 and the second side surface SS2 face each other across a gap therebetween in the first direction X. The first side surface SS1 is connected to the first surface 121 (or the upper surface U1). The first trench T1 corresponds to a space surrounded by the first side surface SS1, the second side surface SS2, and the bottom surface B1. Comparing the first side surface SS1 with the sloped surface S1 in slope reveals that the first side surface SS1 is sloped steeper than the sloped surface S1 is.

A gap D1 between the first side surface SS1 and the second side surface SS2 on an upper part of the first trench T1 is larger than a gap D2 between the first side surface SS1 and the second side surface SS2 on a lower part of the first trench T1. In other words, the first trench T1 is formed such that its width along the first direction X decreases toward the bottom surface B1.

In the second trench T2, the insulating layer 12 has a third side surface SS3, a fourth side surface SS4, and a bottom surface B2. The third side surface SS3 and the fourth side surface SS4 face each other across a gap therebetween in the first direction X. The third side surface SS3 is connected to the second surface 122 (or the upper surface U2). The second trench T2 corresponds to a space surrounded by the third side surface SS3, the fourth side surface SS4, and the bottom surface B2. Comparing the third side surface SS3 with the sloped surface S2 in slope reveals that the third side surface SS3 is sloped steeper than the sloped surface S2 is.

Similar to the first trench T1, the second trench T2 is formed such that its width along the first direction X decreases toward the bottom surface B2.

The organic layer OR will then be described.

The organic layer OR includes a first portion OR1, a second portion OR2, a third portion OR3, a fourth portion OR4, and a fifth portion OR5. These first portion OR1, second portion OR2, third portion OR3, fourth portion OR4, and fifth portion OR5 each include the light-emitting layer EL that emits light of identical color.

The first portion OR1 is disposed in the opening OP and covers the first electrode E1. The second electrode E2 is stacked on the first portion OR1. The first portion OR1 is sandwiched between the first electrode E1 and the second electrode E2. Therefore, the first portion OR1 can form a light-emitting region of the display element 20.

The second portion OR2 is disposed on the first surface 121. The second portion OR2 is connected to the first portion OR1. In the example shown in FIG. 4, the second portion OR2 is formed to extend continuously over the sloped surface S1 and the upper surface U1. The second portion OR2, however, may be disconnected in the middle of its extension over the sloped surface S1 and the upper surface U1. A part of the second portion OR2 lies on an extension line from the first side surface SS1, and on this part, respective end surfaces of the functional layer F1, the light-emitting layer EL, and the functional layer F2 are substantially aligned. The second electrode E2 is stacked on the second portion OR2, and covers respective end surfaces of the functional layer F1, the light-emitting layer EL, and the functional layer F2.

Such a second portion OR2 is sandwiched between the insulating layer 12 and the second electrode E2, and therefore hardly emits light.

The third portion OR3 is disposed in the first trench T1 and is separated from the second portion OR2. In the example shown in FIG. 4, the third portion OR3 is disposed on the second side surface SS2 in the first trench T1 but is hardly disposed on the first side surface SS1 connected to the first surface 121. The third portion OR3 is disposed on a part of the bottom surface B1 in some cases, but may be hardly disposed on the bottom surface B1. The third portion OR3 is in contact with the second side surface SS2. Another thin film, however, may be interposed between the second side surface SS2 and the third portion OR3. The second electrode E2 covers the third portion OR3.

Such a third portion OR3 is sandwiched between the insulating layer 12 and the second electrode E2 and is completely separated from the first portion OR1, and therefore emits no light. Since the third portion OR3 does not contribute to light emission, the second electrode E2, which covers the entire third portion OR3 as described above, may be configured otherwise. For example, the second electrode E2 may cover a part of the third portion OR3 or the second electrode E2 covering the third portion OR3 may be omitted. The second electrode E2 may be discontinuous between a pixel including the second electrode E2 and a pixel adjacent to that pixel.

Between the second portion OR2 and the third portion OR3, the second electrode E2 is disposed on the first side surface SS1 without interposing the organic layer OR between the first side surface SS1 and the second electrode E2. The second electrode E2 is in contact with the first side surface SS1. Another thin film, however, may be interposed between the first side surface SS1 and the second electrode E2. The second electrode E2 is in contact with at least a part of the bottom surface B1. Another thin film, however, may be interposed between the bottom surface B1 and the second electrode E2. When the first trench T1 penetrates to the insulating layer 11, the second electrode E2 is in contact with the insulating layer 11. Another thin film, however, may be interposed between the insulating layer 11 and the second electrode E2.

The fourth portion OR4 is disposed on the second surface 122. The fourth portion OR4 is connected to the first portion OR1. In the example shown in FIG. 4, the fourth portion OR4 is formed to extend continuously over the sloped surface S2 and the upper surface U2. The fourth portion OR4, however, may be discontinuous in the middle of its extension over the sloped surface S2 and the upper surface U2. A part of the fourth portion OR4 lies on an extension line from the third side surface SS3, and on this part, respective end surfaces of the functional layer F1, the light-emitting layer EL, and the functional layer F2 are substantially aligned. The second electrode E2 is stacked on the fourth portion OR4 and covers respective end surfaces of the functional layer F1, the light-emitting layer EL, and the functional layer F2.

Such a fourth portion OR4 is sandwiched between the insulating layer 12 and the second electrode E2, and therefore hardly emits light.

The fifth portion OR5 is disposed in the second trench T2 and is separated from the fourth portion OR4. In the example shown in FIG. 4, the fifth portion OR5 is disposed on the fourth side surface SS4 in the second trench T2, but is hardly disposed on the third side surface SS3 connected to the second surface 122. The fifth portion OR5 is disposed on a part of the bottom surface B2 in some cases, but may be hardly disposed on the bottom surface B2. The fifth portion OR5 is in contact with the fourth side surface SS4. Another thin film, however, may be interposed between the fourth side surface SS4 and the fifth portion OR5. The second electrode E2 covers the fifth portion OR5.

Such a fifth portion OR5 is sandwiched between the insulating layer 12 and the second electrode E2 and is completely separated from the first portion OR1, and therefore emits no light. Since the fifth portion OR5 does not contribute to light emission, the second electrode E2, which covers the entire fifth portion OR5 as described above, may be configured otherwise. For example, the second electrode E2 may cover a part of the fifth portion OR5 or the second electrode E2 covering the fifth portion OR5 may be omitted. The second electrode E2 may be discontinuous between a pixel including the second electrode E2 and a pixel adjacent to that pixel.

Between the fourth portion OR4 and the fifth portion OR5, the second electrode E2 is disposed on the third side surface SS3 without interposing the organic layer OR between the third side surface SS3 and the second electrode E2. The second electrode E2 is in contact with the third side surface SS3. Another thin film, however, may be interposed between the third side surface SS3 and the second electrode E2. The second electrode E2 is in contact with at least a part of the bottom surface B2. Another thin film, however, may be interposed between the bottom surface B2 and the second electrode E2. When the second trench T2 penetrates to the insulating layer 11, the second electrode E2 is in contact with the insulating layer 11. Another thin film, however, may be interposed between the insulating layer 11 and the second electrode E2.

Each of the layers making up such an organic layer OR is formed by, for example, a vacuum vapor deposition method. The state of an organic material for forming the organic layer OR radially spreading from a vapor deposition source is indicated by single-dot chain lines in FIG. 4.

When the organic material is vapor-deposited after formation of the insulating layer 12 having the opening OP, the first trench T1, and the second trench T2, the second side surface SS2 and the fourth side surface SS4 lie on a path for introducing the organic material while the first side surface SS1 and the third side surface SS3 are out of the path for introducing the organic material.

As a result, as shown in FIG. 4, the organic layer OR is formed on the second side surface SS2 and the fourth side surface SS4, but little organic layer OR is formed on the first side surface SS1 and the third side surface SS3.

As described above, the third portion OR3 corresponding to the peripheral portion of the organic layer OR is separated from the first portion OR1 contributing to light emission and from the second portion OR2 connected to the first portion OR1. The fifth portion OR5 corresponding to the peripheral portion of the organic layer OR is separated from the fourth portion OR4 connected to the first portion OR1. This configuration suppresses undesired current leakage (e.g., a problem of current flowing between the first electrode E1 and the second electrode E2 not through the light-emitting layer EL but through the functional layer F1) and the like at the peripheral portion of the organic layer OR, thus suppressing a deterioration in the performance of the display element 20.

Figure 5:
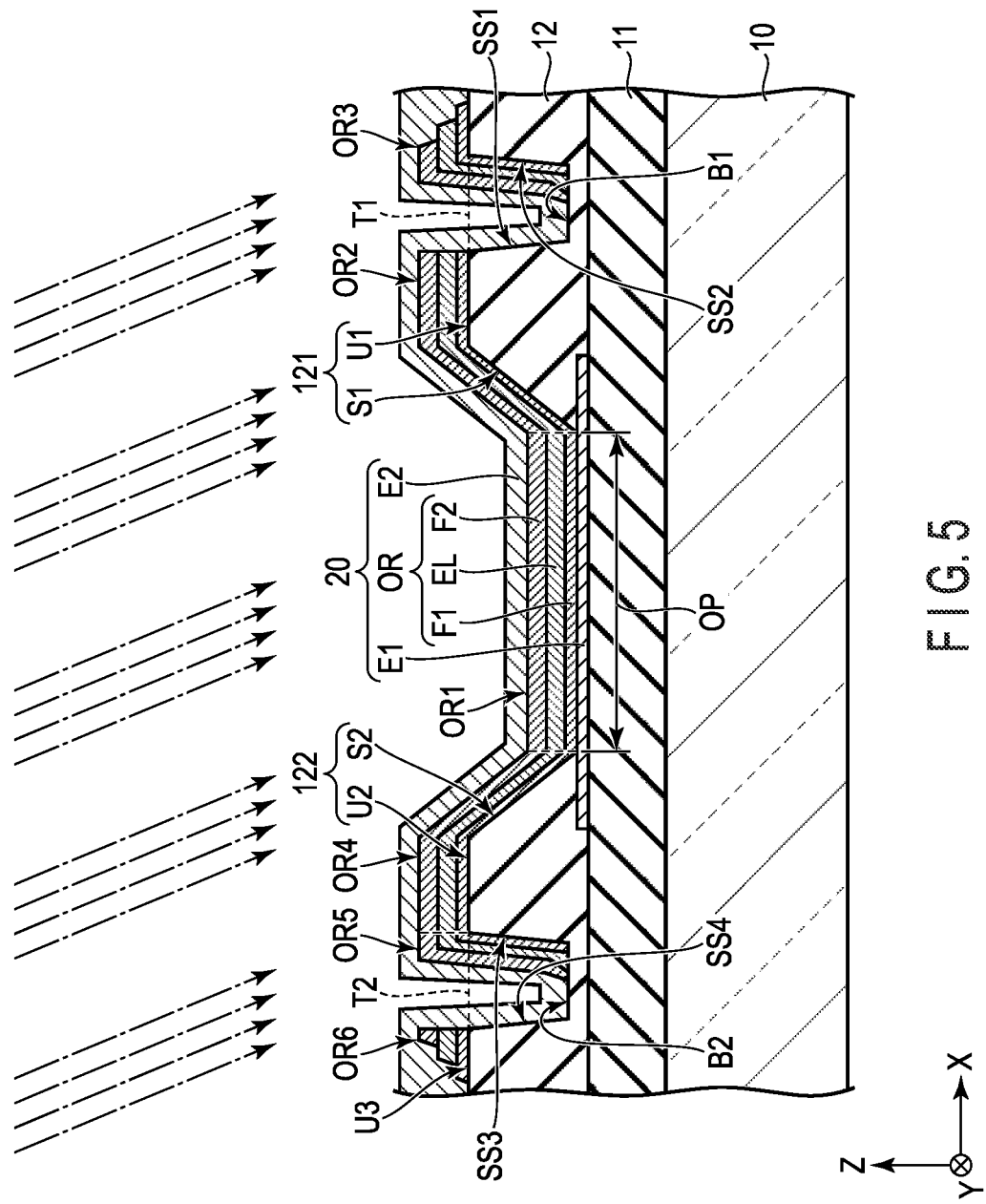
FIG. 5 is a cross-sectional view of another example of the display element 20.

FIG. 5 is a cross-sectional view of another example of the display element 20. The example shown in FIG. 5 is different from the example shown in FIG. 4 in the shape of the organic layer OR.

The organic layer OR has the first portion OR1, the second portion OR2, the third portion OR3, the fourth portion OR4, the fifth portion OR5, and a sixth portion OR6. These first portion OR1, second portion OR2, third portion OR3, fourth portion OR4, fifth portion OR5, and sixth portion OR6 each include the light-emitting layer EL that emits light of identical color. The second electrode E2 covers the first portion OR1, the second portion OR2, the third portion OR3, the fourth portion OR4, the fifth portion OR5, and the sixth portion OR6.

The first portion OR1 is disposed in the opening OP and covers the first electrode E1.

The second portion OR2 is disposed on the first surface 121 and is connected to the first portion OR1.

The third portion OR3 is disposed in the first trench T1 and is separated from the second portion OR2. In the example shown in FIG. 5, the third portion OR3 is disposed on the second side surface SS2 in the first trench T1, but is hardly disposed on the first side surface SS1 connected to the first surface 121. The third portion OR3 is disposed on a part of the bottom surface B1 in some cases, but may be hardly disposed on the bottom surface B1. The third portion OR3 is in contact with the second side surface SS2. Another thin film, however, may be interposed between the second side surface SS2 and the third portion OR3.

Between the second portion OR2 and the third portion OR3, the second electrode E2 is disposed on the first side surface SS1 without interposing the organic layer OR between the first side surface SS1 and the second electrode E2. The second electrode E2 is in contact with the first side surface SS1. Another thin film, however, may be interposed between the first side surface SS1 and the second electrode E2. The second electrode E2 is in contact with at least a part of the bottom surface B1. Another thin film, however, may be interposed between the bottom surface B1 and the second electrode E2. When the first trench T1 penetrates to the insulating layer 11, the second electrode E2 is in contact with the insulating layer 11. Another thin film, however, may be interposed between the insulating layer 11 and the second electrode E2. Since the third portion OR3 does not contribute to light emission, the second electrode E2, which covers the entire third portion OR3 as shown in FIG. 5, may be configured otherwise. For example, the second electrode E2 may cover a part of the third portion OR3 or the second electrode E2 covering the third portion OR3 may be omitted. The second electrode E2 may be discontinuous between a pixel including the second electrode E2 and a pixel adjacent to that pixel.

The fourth portion OR4 is disposed on the second surface 122 and is connected to the first portion OR1.

The fifth portion OR5 is disposed in the second trench T2 and is connected to the fourth portion OR4. In the example shown in FIG. 5, the fifth portion OR5 is disposed on the third side surface SS3 connected to the second surface 122 in the second trench T2, but is not disposed on the fourth side surface SS4. The fifth portion OR5 is disposed on a part of the bottom surface B2 in some cases, but may be hardly disposed on the bottom surface B2. The fifth portion OR5 is in contact with the third side surface SS3. Another thin film, however, may be interposed between the third side surface SS3 and the fifth portion OR5.

The sixth portion OR6 is disposed on an upper surface U3 of the insulating layer 12. The second trench T2 is formed between the upper surface U2 and the upper surface U3. Such a sixth portion OR6 is separated from the fifth portion OR5.

Between the fifth portion OR5 and the sixth portion OR6, the second electrode E2 is disposed on a fourth side surface SS4 without interposing the organic layer OR between the fourth side surface SS4 and the second electrode E2. The second electrode E2 is in contact with the fourth side surface SS4. Another thin film, however, may be interposed between the fourth side surface SS4 and the second electrode E2. The second electrode E2 is in contact with at least a part of the bottom surface B2. Another thin film, however, may be interposed between the bottom surface B2 and the second electrode E2. When the second trench T2 penetrates to the insulating layer 11, the second electrode E2 is in contact with the insulating layer 11. Another thin film, however, may be interposed between the insulating layer 11 and the second electrode E2. Since the sixth portion OR6 does not contribute to light emission, the second electrode E2, which covers the entire sixth portion OR6 as shown in FIG. 5, may be configured otherwise. For example, the second electrode E2 may cover a part of the sixth portion OR6, or the second electrode E2 covering the sixth portion OR6 may be omitted. The second electrode E2 may be discontinuous between a pixel including the second electrode E2 and a pixel adjacent to that pixel.

Each of the layers making up such an organic layer OR is formed by, for example, the vacuum vapor deposition method, as in the example shown in FIG. 4. In this case, however, an oblique vapor deposition method is adopted, according to which vapor deposition is performed in a direction oblique against a normal to the base 10. The state of the organic material for forming the organic layer OR being introduced with directivity from the vapor deposition source is indicated by single-dot chain lines in FIG. 5.

When the organic material is vapor-deposited after formation of the insulating layer 12 having the opening OP, the first trench T1, and the second trench T2, the second side surface SS2 and the third side surface SS3 lie on a path for introducing the organic material while the first side surface SS1 and the fourth side surface SS4 are out of path for introducing the organic material.

As a result, as shown in FIG. 5, the organic layer OR is formed on the second side surface SS2 and the third side surface SS3 as little organic layer OR is formed on the first side surface SS1 and the fourth side surface SS4.

As described above, the third portion OR3 corresponding to the peripheral portion of the organic layer OR is separated from the first portion OR1 contributing to light emission and from the second portion OR2 connected to the first portion OR1. The sixth portion OR6 corresponding to the peripheral portion of the organic layer OR is separated from the fourth portion OR4 connected to the first portion OR1 and from the fifth portion OR5 connected to the fourth portion OR4. This configuration suppresses undesired current leakage and the like at the peripheral portion, thus suppressing a deterioration in the performance of the display element 20.

Examples of shapes of trenches formed on the insulating layer 12 will then be described. In each of the following examples to be described, the color of light emission from sub-pixels SP11 and SP12 is red (R), the color of light emission from sub-pixels SP21 and SP22 is green (G), the sub-pixels SP11 and SP21 are arranged in the first direction X, the sub-pixels SP12 and SP22 are arranged in the first direction X, the sub-pixels SP11 and SP12 are arranged in the second direction Y, and the sub-pixels SP21 and SP22 are arranged in the second direction Y. Each of the following drawings shows first electrodes RE1 and organic layers ROR for red that make up display elements of the sub-pixels SP11 and SP12 and first electrodes GE1 and organic layers GOR for green that make up display elements of the sub-pixels SP21 and SP22.

Figure 6:
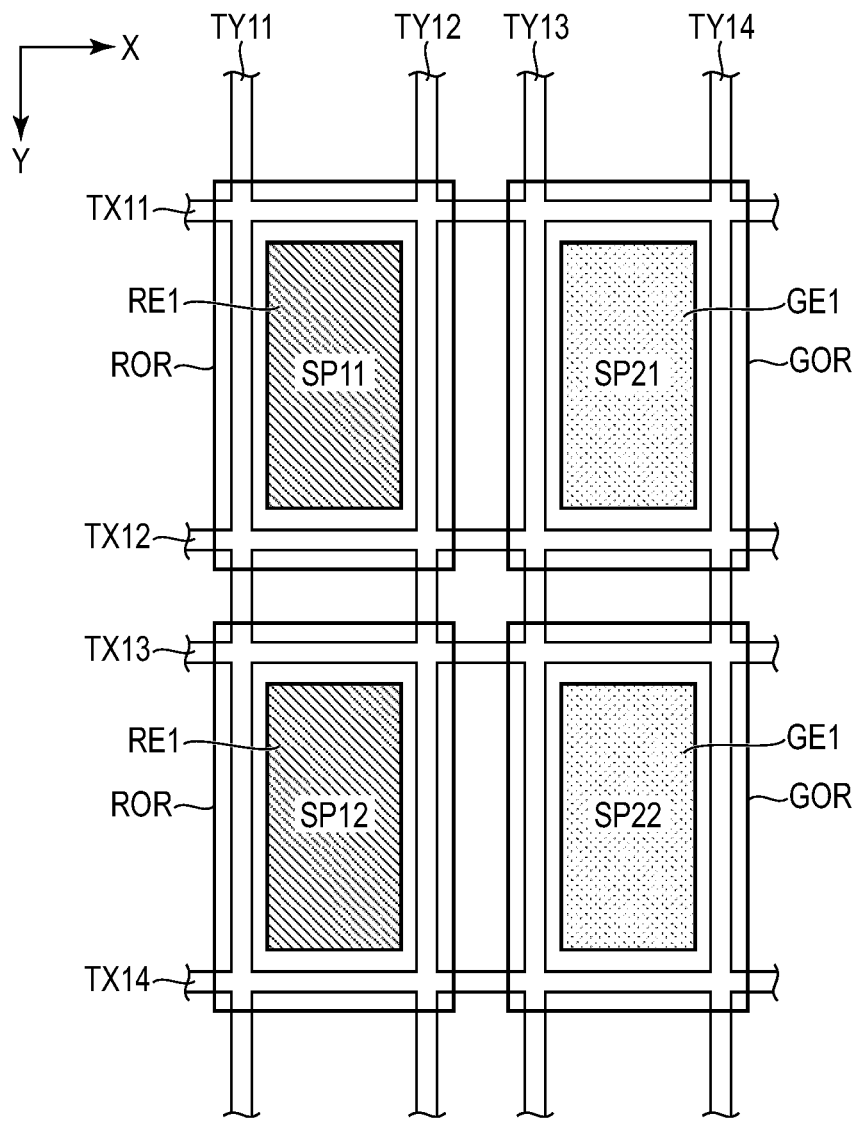
FIG. 6 is a plan view of an example of a first shape of trenches.

FIG. 6 is a plan view of an example of a first shape of trenches.

Trenches TY11 to TY14 each extend along the second direction Y.

The trenches TY11 and TY12 are formed to extend continuously over the sub-pixels SP11 and SP12. Respective first electrodes RE1 of the sub-pixels SP11 and SP12 are located between the trench TY11 and the trench TY12.

The trenches TY13 and TY14 are formed to extend continuously over the sub-pixels SP21 and SP22. Respective first electrodes GE1 of the sub-pixels SP21 and SP22 is located between the trench TY13 and the trench TY14.

The trenches TX11 to TX14 extend along the first direction X and intersect the trenches TY11 to TY14, respectively.

The trenches TX11 and TX12 are formed to extend continuously over the sub-pixels SP11 and SP21. The first electrode RE1 of the sub-pixel SP11 and the first electrode GE1 of the sub-pixel SP21 are located between the trench TX11 and the trench TX12.

The trenches TX13 and TX14 are formed to extend continuously over the sub-pixels SP12 and SP22. The first electrode RE1 of the sub-pixel SP12 and the first electrode GE1 of the sub-pixel SP22 are located between the trench TX13 and the trench TX14.

Paying attention to the sub-pixel SP11 reveals that the first electrode RE1 is encircled with the trenches TY11 and TY12 and the trenches TX11 and TX12. For example, the trench TY11 corresponds to the above first trench T1, the trench TY12 corresponds to the above second trench, the trench TX11 corresponds to a third trench connected to the trenches TY11 and TY12, and the trench TX12 corresponds to a fourth trench connected to the trenches TY11 and TY12. In a plan view, the trenches TY11 and TY12 and the trenches TX11 and TX12 do not overlap the first electrode RE1.

A region where the organic layer ROR is formed extends to outside of the trenches TY11 and TY12 and to outside of the trenches TX11 and TX12. In at least one of the trench TY11, the trench TY12, the trench TX11, and the trench TX12, the organic layer ROR is separated into a portion contributing to light emission and a peripheral portion. This suppresses a degradation in the performance of the display element.

In each of the other sub-pixels SP12, SP21, and SP22, the organic layer extends to outside of the four trenches encircling the first electrode and is separated into a portion contributing to display and a peripheral portion at least in one trench, in the same manner as in the sub-pixel SP11. Hence, in each sub-pixel, a degradation in the performance of the display element is suppressed.

FIG. 7 is a plan view of an example of a second shape of the trenches.

The second shape is different from the first shape in that the trenches extending in the first direction X and the trenches extending in the second direction Y are each made discontinuous in such a way as to form a loop of trench in each sub-pixel. A trench T11 of the sub-pixel SP11 encircles the first electrode RE1, a trench T12 of the sub-pixel SP12 encircles the first electrode RE1, a trench T21 of the sub-pixel SP21 encircles the first electrode GE1, and a trench T22 of the sub-pixel SP22 encircles the first electrode GE1. The trenches T11, T12, T21, and T22 are separated from each other.

Paying attention to the sub-pixel SP11 reveals that the region where the organic layer ROR is formed extends to outside of the trench T11. In at least a part of the trench T11, the organic layer ROR is separated into a portion contributing to display and a peripheral portion. Each of the other sub-pixels SP12, SP21, and SP22 are configured in the same manner as the sub-pixel SP11. Thus, the second shape offers the same effects as the first shape offers.

Figure 8:
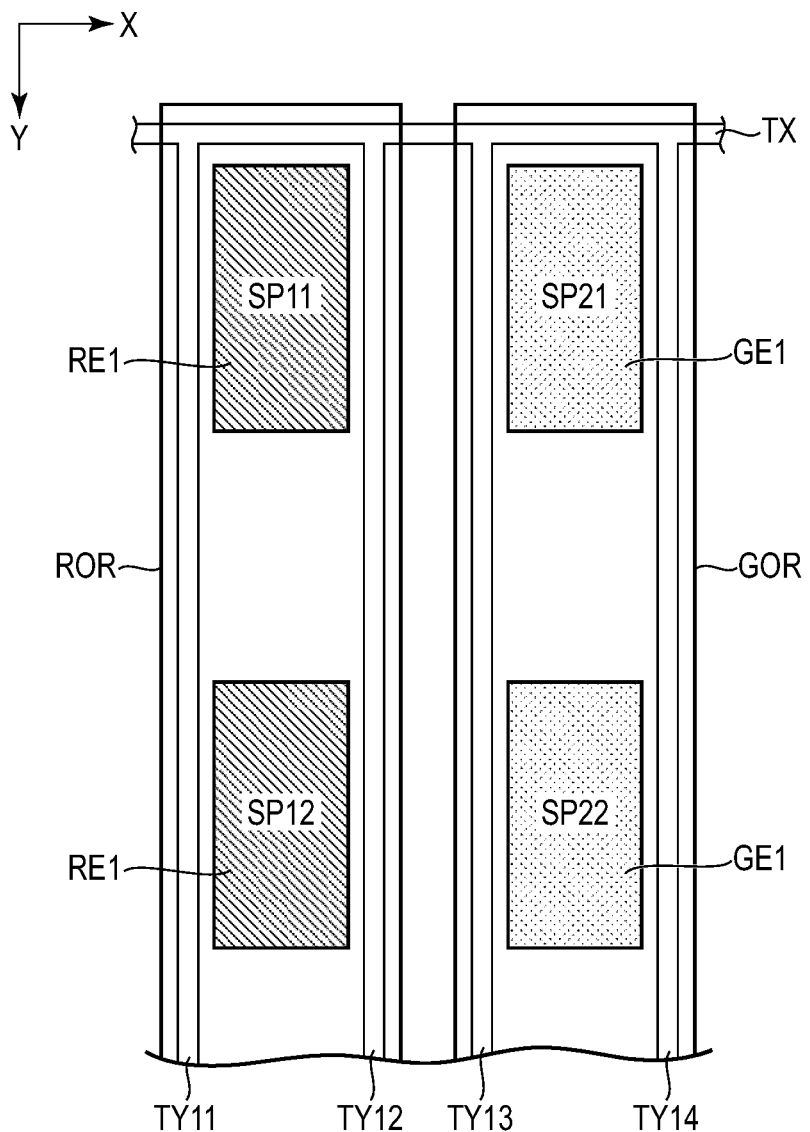
FIG. 8 is a plan view of an example of a third shape of the trenches.

FIG. 8 is a plan view of an example of a third shape of the trenches.

The third shape is different from the first shape in that a trench between sub-pixels arranged in the second direction Y is omitted. For example, neither a trench traversing between the sub-pixel SP11 and the sub-pixel SP12 nor a trench traversing between the sub-pixel SP21 and the sub-pixel SP22 is formed. On the outermost periphery, however, a trench TX extending in the first direction X is formed. The trench TX is formed as a continuous trench connecting the trenches TY11 to TY14, but may be discontinuous between the trench TY12 and the trench TY13.

The organic layer ROR is disposed to extend over the sub-pixels SP11 and SP12. Both ends of a region where the organic layer ROR is formed, the ends being on both sides along the first direction X, extend to outside the trenches TY11 and TY12, while one end of the region, the one end being on one side along the second direction Y, extends to outside the trench TX.

The organic layer GOR is disposed to extend over the sub-pixels SP21 and SP22. Both ends of a region where the organic layer GOR is formed, the ends being on both sides along the first direction X, extend to outside the trenches TY13 and TY14, while one end of the region, the one end being on one side along the second direction Y, extends to outside the trench TX. It should be noted that the other end (not illustrated) of the organic layer ROR, the other end being on the other side along the second direction Y, and the other end (not illustrated) of the organic layer GOR, the other end being on the other side along the second direction Y, also extend to outside trenches, respectively.

The third shape as described above offers the same effects as the first shape offers.

Figure 9:
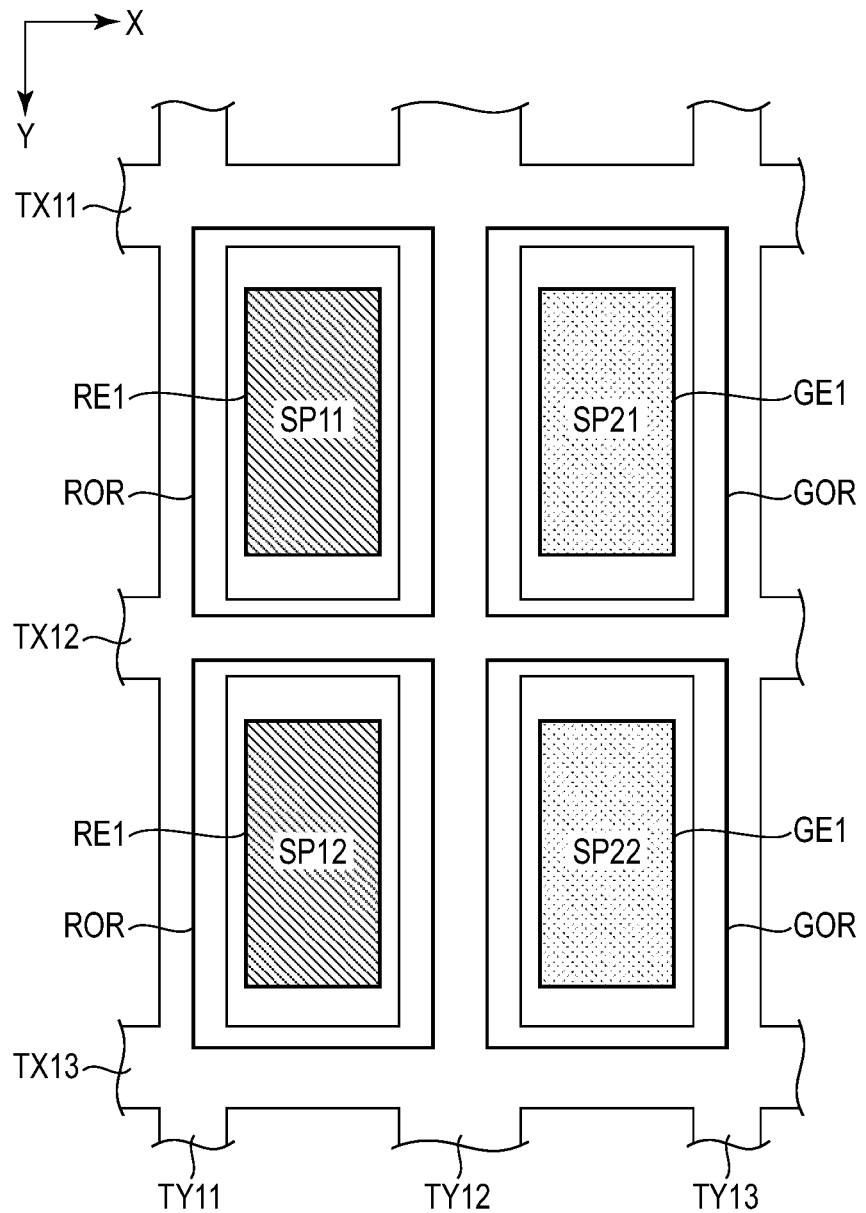
FIG. 9 is a plan view of an example of a fourth shape of the trenches.

FIG. 9 is a plan view of an example of a fourth shape of the trenches.

The fourth shape is different from the first shape in that two trenches between adjacent sub-pixels are replaced with one trench. For example, the trench TX12 is formed between the sub-pixel SP11 and the sub-pixel SP12 and between the sub-pixel SP21 and the sub-pixel SP22. The trench TY12 is formed between the sub-pixel SP11 and the sub-pixel SP21 and between the sub-pixel SP12 and the sub-pixel SP22.

Paying attention to the sub-pixel SP11 reveals that the first electrode RE1 is encircled with the trenches TY11 and TY12 and the trenches TX11 and TX12. The edge of the organic layer ROR lies in the trenches TY11 and TY12 and in the trenches TX11 and TX12.

The fourth shape as described above offers the same effects as the first shape offers.

Figure 10:
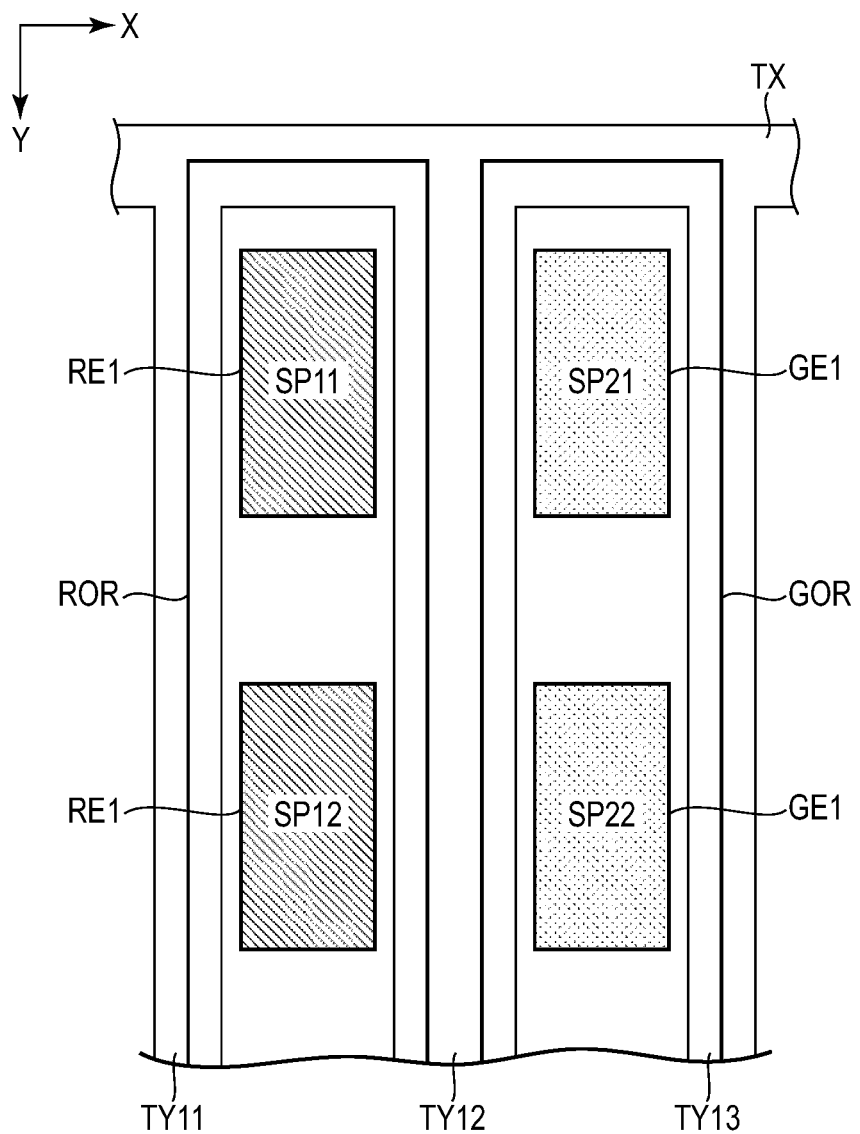
FIG. 10 is a plan view of an example of a fifth shape of the trenches.

FIG. 10 is a plan view of an example of a fifth shape of the trenches.

The fifth shape is different from the third shape in that two trenches between adjacent sub-pixels are replaced with one trench. For example, the trench TY12 is formed between the sub-pixel SP11 and the sub-pixel SP21 and between the sub-pixel SP12 and the sub-pixel SP22. It should be noted that in the fifth shape, no trench traversing between sub-pixels arranged in the second direction Y is formed, as in the third shape.

The fifth shape as described above offers the same effects as the first shape offers.

The first to fifth shapes described above apply also to sub-pixels whose color of light emission is blue (B). Hence a deterioration in the performance of display elements, whose respective colors of light emission are red, green, and blue, is suppressed.

Examples of cross-sectional structures each extending across two sub-pixels with different colors of light emission will then be described. In drawings corresponding respectively to examples to be described below, only the principle part is illustrated and layers below the insulating layer 11 as well as layers above the organic layer OR are not illustrated. Each example shows a cross-sectional structure extending across the sub-pixel SP11 for red and the sub-pixel SP21 for green that are arranged in the first direction X. The sub-pixel SP11 includes the first electrode RE1 and the organic layer ROR, and the sub-pixel SP21 includes the first electrode GE1 and the organic layer GOR.

Figure 11:
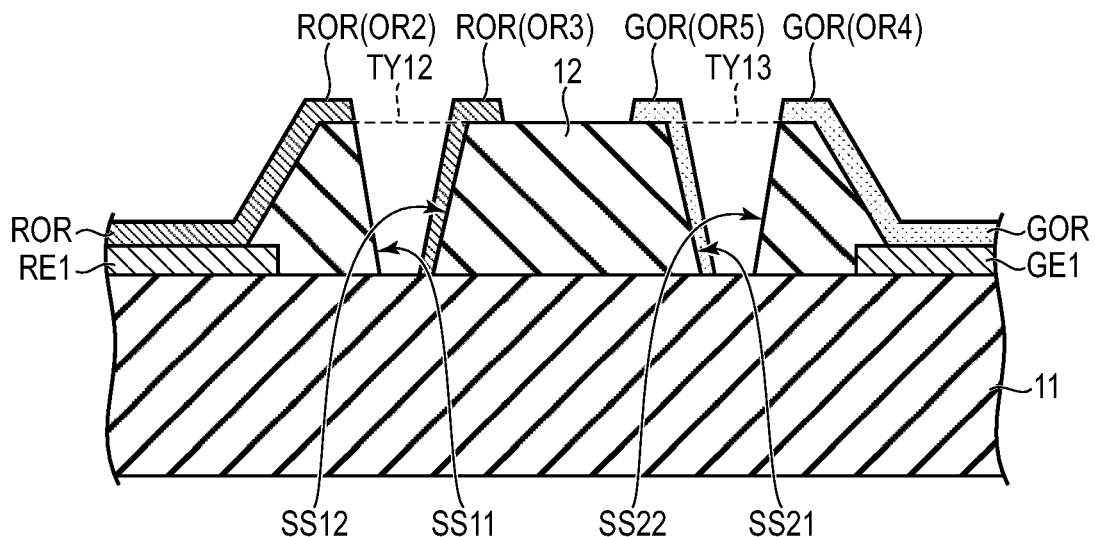
FIG. 11 is a cross-sectional view of an example of a first structure.

FIG. 11 is a cross-sectional view of an example of a first structure. In the first structure, for example, two trenches TY12 and TY13 are formed between the first electrode RE1 and the first electrode GE1, as in the first shape of FIG. 6.

The organic layer ROR is disposed on the first electrode RE1 and on the insulating layer 12 as well, and is separated in the trench TY12. Specifically, the third portion OR3 is disposed on the side surface SS12 of the trench TY12, but is not disposed on the side surface SS11. In other words, at least a part of the side surface SS11 is exposed from the organic layer ROR, and the third portion OR3 of the organic layer ROR is separated from the second portion OR2.

The organic layer GOR is disposed on the first electrode GE1 and on the insulating layer 12 as well, and is separated in the trench TY13. Specifically, the fifth portion OR5 is disposed on the side surface SS21 of the trench TY13, but is not disposed on the side surface SS22. In other words, at least a part of the side surface SS22 is exposed from the organic layer GOR, and the fifth portion OR5 of the organic layer GOR is separated from the fourth portion OR4.

The fifth portion OR5 of the organic layer GOR is separated from the third portion OR3 of the organic layer ROR. The fifth portion OR5 and third portion OR3, however, may be in contact with each other.

As described above with reference to FIG. 4, these organic layers ROR and GOR are formed by radially vapor-depositing an organic material.

Figure 12:
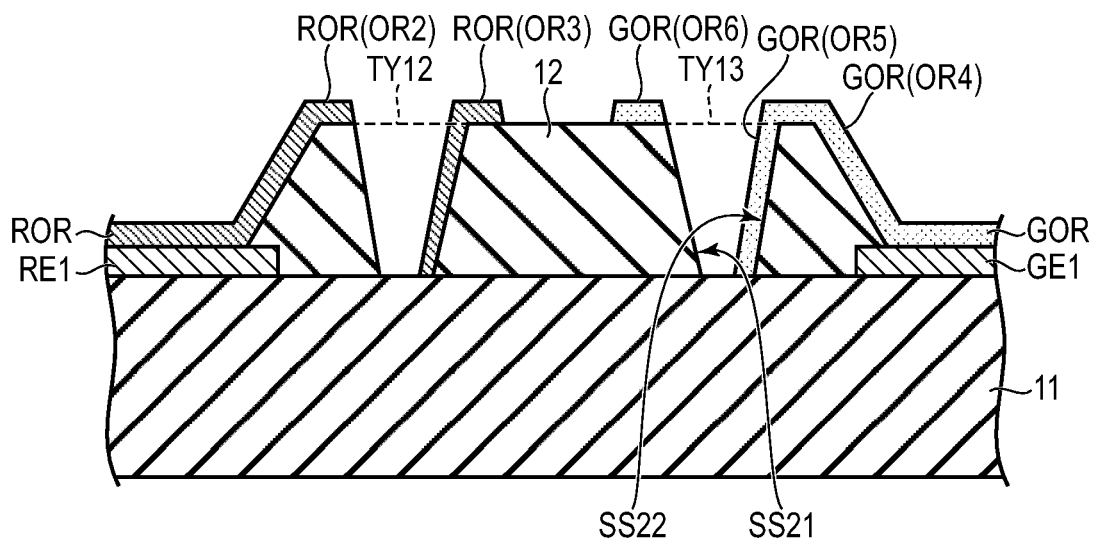
FIG. 12 is a cross-sectional view of an example of a second structure.

FIG. 12 is a cross-sectional view of an example of a second structure. In the second structure, the organic layer ROR is separated in the trench TY12, as in the first structure.

The organic layer GOR is separated in the trench TY13. Specifically, the fifth portion OR5 is connected to the fourth portion OR4 and is disposed on the side surface SS22 of the trench TY13, but is not disposed on the side surface SS21. In other words, at least a part of the side surface SS21 is exposed from the organic layer GOR, and the sixth portion OR6 of the organic layer GOR is separated from the fifth portion OR5.

These organic layers ROR and GOR are formed by the oblique vapor deposition method, as described above with reference to FIG. 5.

Figure 13:
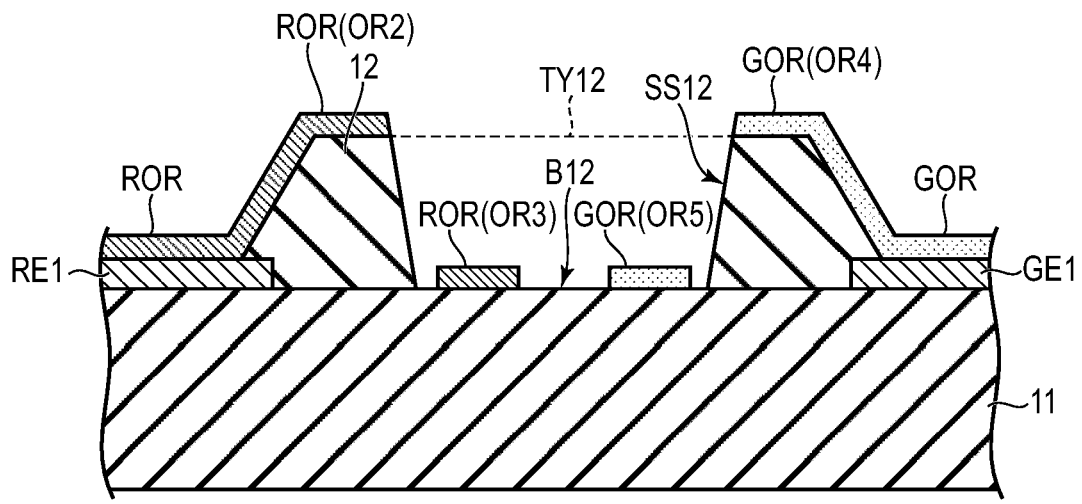
FIG. 13 is a cross-sectional view of an example of a third structure.

FIG. 13 is a cross-sectional view of an example of a third structure. In the third structure, for example, one trench TY12 is formed between the first electrode RE1 and the first electrode GE1, as in the fourth shape of FIG. 9.

The organic layer ROR is separated in the trench TY12. Specifically, the third portion OR3 is disposed on the bottom surface B12 of the trench TY12, but is not disposed on the side surface SS11. In other words, at least a part of the side surface SS11 is exposed from the organic layer ROR, and the third portion OR3 of the organic layer ROR is separated from the second portion OR2.

The organic layer GOR is separated in the trench TY12. Specifically, the fifth portion OR5 is disposed on the bottom surface B12 but is not disposed on the side surface SS12. In other words, at least a part of the side surface SS12 is exposed from the organic layer GOR, and the fifth portion OR5 of the organic layer GOR is separated from the fourth portion OR4.

The above examples of the first structure to the third structure have been described as cases where the trench is formed in the insulating layer 12. The trench, however, may be replaced with a protrusion P. Disposing the protrusion P identical in planar shape with the above trench on the insulating layer 12 offers the same effects as the effects achieved in the case of trench formation. As examples of shapes of the protrusion P in a plan view, the examples of shapes of the trenches described with reference to FIGS. 6 to 10 may be adopted.

Figure 14:
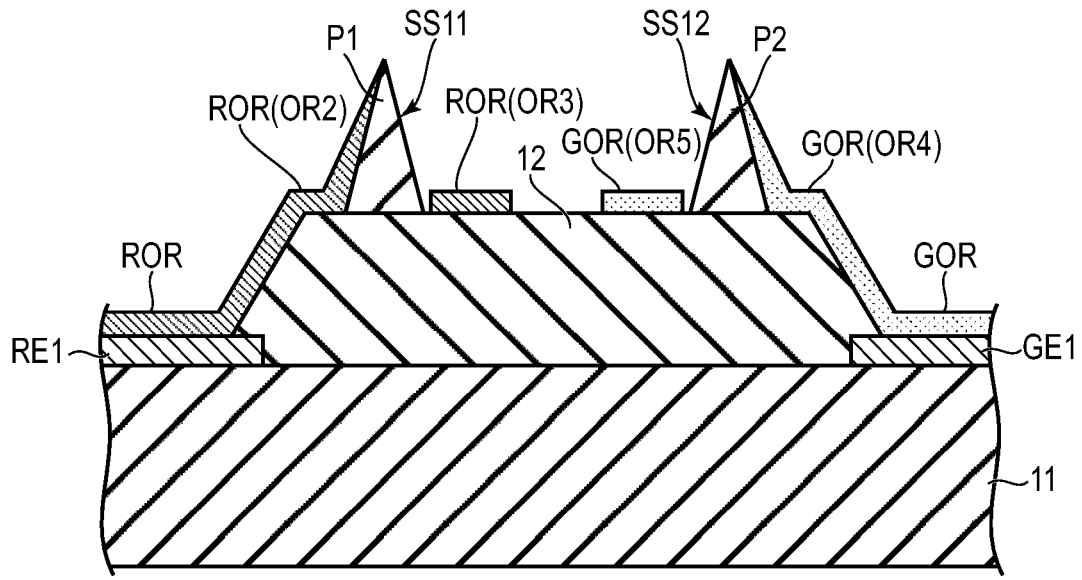
FIG. 14 is a cross-sectional view of an example of a fourth structure.

FIG. 14 is a cross-sectional view of an example of a fourth structure. The insulating layer 12 between the first electrode RE1 and the first electrode GE1 does not have a trench. Protrusions P1 and P2 are disposed on the insulating layer 12. The protrusions P1 and P2 each have a substantially triangular cross section. These protrusions P1 and P2 can be replaced with, for example, the trenches TY12 and TY13 shown in FIGS. 6 and 8, and can also be replaced with the trenches T11 and T21 shown in FIG. 7.

The organic layer ROR is disposed on the first electrode RE1 and on the insulating layer 12 as well, and is separated at the protrusion P1. Specifically, the third portion OR3 is located between the protrusion P1 and the protrusion P2 and is disposed on the insulating layer 12, but is not disposed on the side surface SS11 of the protrusion P1. In other words, at least a part of the side surface SS11 is exposed from the organic layer ROR, and the third portion OR3 of the organic layer ROR is separated from the second portion OR2.

The organic layer GOR is disposed on the first electrode GE1 and on the insulating layer 12 as well, and is separated at the protrusion P2. Specifically, the fifth portion OR5 is located between the protrusion P1 and the protrusion P2 and is disposed on the insulating layer 12, but is not disposed on the side surface SS12 of the protrusion P2. In other words, at least a part of the side surface SS12 is exposed from the organic layer GOR, and the fifth portion OR5 of the organic layer GOR is separated from the fourth portion OR4.

FIG. 15 is a cross-sectional view of an example of a fifth structure. The protrusion P is disposed on the insulating layer 12. The protrusion P has a substantially trapezoidal cross section. The protrusion P can be replaced with, for example, the trench TY12 shown in FIGS. 9 and 10. The following description relates to an assumed case where the organic layer GOR is formed after the organic layer ROR is formed.

The organic layer ROR is disposed on the first electrode RE1 and on the insulating layer 12 as well, and is separated at the protrusion P. Specifically, the second portion OR2 is disposed on the side surface SS12 of the protrusion P. The third portion OR3 is disposed on the insulating layer 12 between the protrusion P and the first electrode GE1, but is not disposed on the side surface SS11 of the protrusion P. In other words, at least a part of the side surface SS11 is exposed from the organic layer ROR, and the third portion OR3 of the organic layer ROR is separated from the second portion OR2.

The organic layer GOR is disposed on the first electrode GE1 and on the insulating layer 12 as well, and is separated at the protrusion P. Specifically, the fourth portion OR4 covers the third portion OR3 of the organic layer ROR and is disposed on the side surface SS11 of the protrusion P. The fifth portion OR5 is disposed on the second portion OR2 of the organic layer ROR, but is not disposed on the side surface SS12 of the protrusion P. In other words, at least a part of the side surface SS12 is exposed from the organic layer GOR, and the fifth portion OR5 of the organic layer GOR is separated from the fourth portion OR4.

FIG. 16 is a cross-sectional view of an example of a sixth structure. The sixth structure is different from the fifth structure in that the protrusion P has a substantially triangular cross section.

The organic layer ROR is disposed on the first electrode RE1 and on the insulating layer 12 as well, and is separated at the protrusion P. Specifically, the organic layer ROR is separated into the second portion OR2 located between the protrusion P and the first electrode RE1 and the third portion OR3 located between the protrusion P and the first electrode GE1.

The organic layer GOR is disposed on the first electrode GE1 and on the insulating layer 12 as well, and is separated at the protrusion P. Specifically, the organic layer GOR is separated into the fourth portion OR4 located between the protrusion P and the first electrode GE1 and the fifth portion OR5 located between the protrusion P and the first electrode RE1.

In these first to sixth structures, each of the organic layers ROR and GOR is separated into a portion contributing to display and a peripheral portion, which suppresses a deterioration in the performance of the display element.

The first to sixth structures apply also to sub-pixels whose color of light emission is blue (B). In other words, the organic layer BOR that emits blue light is also separated into a portion contributing to display and a peripheral portion, which suppresses a deterioration in the performance of the display element.

Modifications will then be described.

FIG. 17 is a cross-sectional view of a first modification.

The first modification is different from the example shown in FIG. 4 in that the feeder lines FL are disposed directly underneath the first trench T1 and the second trench T2, respectively. The feeder lines FL are disposed on the insulating layer 11, and are each made of, for example, the same material as the material making up the first electrode E1. The first trench T1 and the second trench T2 each penetrate to the feeder line FL. In other words, the feeder lines FL are located respectively at the bottoms of the first trench T1 and the second trench T2.

The second electrode E2 is in contact with the feeder line FL in the first trench T1 and in the second trench T2. As a result, a predetermined voltage is supplied from the feeder line FL to the second electrode E2.

FIG. 18 is a cross-sectional view of a second modification.

The second modification is different from the example shown in FIG. 5 in that the feeder lines FL are disposed directly underneath the first trench T1 and the second trench T2, respectively. The second electrode E2 is in contact with the feeder line FL in the first trench T1 and in the second trench T2. As a result, a predetermined voltage is supplied from the feeder line FL to the second electrode E2.

In the first and second modifications, the feeder lines FL are disposed underneath both the first trench T1 and the second trench T2, respectively. The feeder line FL, however, may be disposed underneath either the first trench T1 or the second trench T2. When the first trench T1 and second trench T2 fail to penetrate the insulating layer 12 and reach the insulating layer 11, the feeder lines FL may be disposed respectively at the bottoms of the first trench T1 and the second trench T2, which bottoms remain in the insulating layer 12.

FIG. 19 is a cross-sectional view of another example of the display element 20.

In the example shown in FIG. 19, the organic layer OR (which includes the light-emitting layer EL and the functional layers F1 and F2) is disposed as a common organic layer extending over adjacent sub-pixels. For example, the organic layer OR including the light-emitting layer EL for identical color is disposed to extend over the sub-pixels SP31 and SP32 adjacent to each other in the first direction X. Similarly, the organic layer OR including the light-emitting layer EL for identical color is disposed also to extend over sub-pixels adjacent to each other in the second direction Y. Specifically speaking, the organic layer OR including the light-emitting layer EL for identical color is disposed in every sub-pixel SP of the display portion DA. This means that the example shown in FIG. 19 is preferable for use in the display device DSP for single color display. For example, when the color of light emission from each display element 20 is white, placing a color filter counter to the display element 20 achieves multicolor display. When each display element 20 emits UV-rays, on the other hand, placing a wavelength conversion layer counter to the display element 20 achieves multicolor display.

The first trench T1 is formed in the insulating layer 12 between a first electrode E31 of a sub-pixel SP31 and a first electrode E32 of a sub-pixel SP32. In the first trench T1, the organic layer OR is separated into an organic layer OR31 disposed in the sub-pixel SP31 and an organic layer OR32 disposed in the sub-pixel SP32.

The organic layer OR31 is hardly disposed on the first side surface SS1 of the first trench T1.

The organic layer OR32 is disposed on the second side surface SS2 of the first trench T1, but is hardly disposed on the first side surface SS1. The second electrode E2 covering the organic layers OR31 and OR32 is disposed on the first side surface SS1 without interposing the organic layer OR between the first side surface SS1 and the second electrode E2.

When the oblique vapor deposition method described with reference to FIG. 5 is applied, the organic layer OR is separated in a trench between adjacent sub-pixels in the same manner as described above. This suppresses crosstalk between adjacent sub-pixels.

According to the present embodiment described above, a display device capable of suppressing a deterioration in the performance of a display element can be provided.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A display device comprising:
   a base;
   a first insulating layer disposed on the base;
   a first electrode disposed on the first insulating layer;
   a second insulating layer disposed on the first insulating layer and including an opening overlapping the first electrode, a first trench not overlapping the first electrode, a second trench located opposite to the first trench across the opening, a first surface between the opening and the first trench, and a second surface between the opening and the second trench;

an organic layer including a light-emitting layer; and a second electrode covering the organic layer, wherein the organic layer includes:
- a first portion disposed in the opening and covering the first electrode;
- a second portion disposed on the first surface;
- a third portion disposed in the first trench and separated from the second portion;
- a fourth portion disposed on the second surface; and
- a fifth portion disposed in the second trench and separated from the fourth portion;

the second insulating layer further includes:
- a first side surface and a second side surface of the first trench; and
- a third side surface and a fourth side surface of the second trench, the first side surface is connected to the first surface,
the second side surface faces the first side surface,
the third side surface is connected to the second surface,
the fourth side surface faces the third side surface;
the third portion is disposed on the second side surface and is in contact with a bottom of the first trench,
the fifth portion is disposed on the fourth side surface and is in contact with a bottom of the second trench, and
the second electrode is in contact with the first side surface and the third side surface, and covers the third portion and the fifth portion.

2. The display device according to claim 1, wherein the first portion, the second portion, and the third portion each include the light-emitting layer for identical color.

3. The display device according to claim 1, wherein a gap between the first side surface and the second side surface on an upper part of the first trench is larger than a gap between the first side surface and the second side surface on a lower part of the first trench.

4. The display device according to claim 1, wherein the second insulating layer further includes a third trench and a fourth trench that do not overlap the first electrode,
the third trench and the fourth trench are connected respectively to the first trench and the second trench, and
in a plan view, the fourth trench is located opposite to the third trench across the first electrode.

5. The display device according to claim 1, further comprising a feeder line located at a bottom of the first trench, and wherein
the second electrode is in contact with the feeder line in the first trench.

6. The display device according to claim 1, wherein the organic layer further includes at least one of a hole injection layer, a hole transport layer, an electron injection layer, and an electron transport layer.

* * * * *